United States Patent [19]

Masuhara et al.

[11] Patent Number: 4,716,566
[45] Date of Patent: Dec. 29, 1987

[54] ERROR CORRECTING SYSTEM

[75] Inventors: Hiromu Masuhara; Tsunekazu Kimura, both of Tokyo, Japan

[73] Assignee: NEC Corporation, Tokyo, Japan

[21] Appl. No.: 767,596

[22] Filed: Aug. 20, 1985

[30] Foreign Application Priority Data

Aug. 20, 1984 [JP] Japan .................................. 59-172670

[51] Int. Cl.$^4$ ................................................ G06F 11/10
[52] U.S. Cl. ................................................................ 371/37
[58] Field of Search .................... 371/3, 37, 38, 39, 40, 371/67, 49

[56] References Cited

U.S. PATENT DOCUMENTS

| | | | |
|---|---|---|---|
| 3,573,728 | 4/1971 | Kolankowsky | 371/38 |
| 4,417,339 | 11/1983 | Cantarella | 371/37 |
| 4,520,481 | 5/1985 | Israel | 371/37 |
| 4,523,314 | 6/1985 | Burns | 371/38 |
| 4,531,213 | 6/1985 | Scheuneman | 371/3 |

OTHER PUBLICATIONS

R. J. Cooper, "Diagnostic Error-Forcing Circuit", IBM TDB, vol. 19, No. 5, 10/1976, pp. 1833–1834.

*Primary Examiner*—Jerry Smith
*Assistant Examiner*—Robert W. Beausoliel, Jr.
*Attorney, Agent, or Firm*—Schwartz, Jeffery, Schwaab, Mack, Blumenthal & Evans

[57] ABSTRACT

A first error correcting code and a first parity bit associated with a data word are transmitted to an external circuit. Through the external circuit the data word, the first error correcting code and the first parity bit are received and a second error correcting code and a second parity bit associated with the received data word are generated based upon the received data word. An error correction signal is generated when difference between the first and second error correcting codes is found. A parity error signal is generated when the first and second parity bits are different. The error of the received data word is corrected by the error correction circuit only in a case that the error correction signal and the parity error signal are generated. The error correction circuit outputs the received data word without error correction in other cases.

9 Claims, 4 Drawing Figures

| S | P | ERROR CORRECT CKT. 12 |
|---|---|---|
| CORRECT | CORRECT | THROUGH |
| ERROR | CORRECT | THROUGH |
| CORRECT | ERROR | THROUGH |
| ERROR | ERROR | ERROR CORRECTION |

| CASE | $X_a$ | $C_a$ | $P_a$ | $S$ | $m$ | $n$ | OPERATION |
|------|-------|-------|-------|-----|-----|-----|-----------|
| A | O | O | O | 0 | 0 | 0 | THROUGH |
| B | O | O | X | 0 | 1 | 0 | THROUGH |
| C | O | X | O | 1 | 0 | 0 | THROUGH |
| D | X | O | X | 1 | 0 | 0 | THROUGH |
| E | X | X | X | 1 | 0 | 0 | THROUGH |
| F | O | X | X | 1 | 1 | 1 | THROUGH |
| G | X | X | O | 1 | 1 | 1 | THROUGH |
| H | X | O | O | 1 | 1 | 1 | CORRECTION |

FIG. 4

ERROR CORRECTING SYSTEM

BACKGROUND OF THE INVENTION

This invention relates to an error correcting system employing an error correction circuit which corrects errors included in the digital data, and in particular to an improvement of such a system in suppressing wrong error correction to be caused by erroneous operation of the error correction circuit itself.

Because of its intrinsically small redundancy, the information of digital data is subjected to a great change even by a single bit error. It is, therefore, important to take countermeasures against bit errors.

So far, for removing bit errors, there has been used such a technique that makes the data redundant by adding a certain bit or bits thereto, detects bit errors by checking the thus-obtained redundant data, and corrects the bit errors. One example is the so-called parity check technique. This technique can easily detect bit errors, but is inadequate for real time processing because a special processing for obtaining correct data, for example, retransmission of data, is necessary. Another example of the error correction technique is the so-called ECC (Error correcting code) technique. For details, refer, for example, to the articles of R. W. Hamming, "Error Detecting and Error Correcting Codes", The Bell System Technical Journal Vol. XXVI, No. 2, April, 1950, pp. 147–160, and M. Y. Hsiao; "A class of optimal Minimum Odd-weight-column SEC-DED Codes, IBM Journal of Research and Development, July, 1970, pp. 395–401. An error correction circuit, such as that based on ECC technique, enables real time data correction. However, the error correction circuit cannot detect erroneous operation of itself, and therefore, if the erroneous operation occurs, the correct data is made erroneous and destroyed. For avoiding such a problem, conventionally used is a parallel check system which is provided with two or three sets of identical error correcting circuits a correct data being selected according to the comparison of the outputs of the two circuit or a majority decision on the outputs of the three circuits. Since the error correction circuit has a very complicated circuit configuration, however, the parallel check system with two or three sets of the error correction circuits has a large-scale circuit structure and thus is unsuitable in an application where a small-size apparatus is required, e.g. an apparatus mounted in a satellite or an airplane.

SUMMARY OF THE INVENTION

It is, therefore, the principal object of the invention to provide an error correcting system having a simplified configuration in which correct data is prevented from being erroneously changed or destroyed due to erroneous operation of an error correction circuit.

The present invention is featured in that the parity check technique is employed together with the ECC technique and that the data is subjected to error correction only when both of the parity error and the error based on the ECC occur at the same time.

According to the present invention, there is provided an error correcting system which comprises a first error correcting code generator means for generating a first error correcting code C to be added to a data X for the purpose of correcting bit error of that data, a first parity bit generator means for generating a first parity bit p associated with the data X, a transmitting means for transmitting the combination of the data X, the first error correcting code C and the first parity bit p to a memory, a transmission line, or the like external circuit, a receiving means for receiving a combination of the received data $X_a$, a received first error correcting code $C_a$ and a received first parity bit $p_a$ corresponding to the transmitted data X, the transmitted first error correcting code C and the transmitted first parity bit p, respectively, from the memory the transmission line, or the like, a second error correcting code generator means for generating a second error correcting code $C_b$ to be added to the received data $X_a$ for the purpose of correcting the bit error of the received data, a second parity bit generator means for generating a second parity bit $p_b$ associated with the received data $X_a$, an error correction signal generator means for comparing the received first error correcting code $C_a$ and the second error correcting code $C_b$ and generating an error correction signal S designating error bit when difference between the two codes $C_a$ and $C_b$ is found, a parity check means for comparing the received first parity bit $p_a$ and the second parity bit $p_b$ and outputting a parity error signal m when the two parity bits are different, an error correction permitting means for outputting an error correction permitting signal n in response to the simultaneous generation of the error correction signal S which indicates the presence of error and the parity error signal m which indicates difference between $p_a$ and $p_b$, and an error correction circuit for correcting the error of the received data $X_a$ in accordance with the error correction signal S when the error correction permitting signal is output, and for outputting the received data $X_a$ without error correction when the error correction permitting signal is not output.

The above-mentioned and other objects and features will be clarified by the following description of the embodiment of the invention with reference to the drawings.

BRIEF DESCRIPTION OF THE DRAWINGS

FIG. 2 shows a data format written in a memory 5 of FIG. 1; and

FIGS. 3 and 4 give tables summarizing operational conditions of an error correction permitting circuit shown in FIG. 1.

DETAILED DESCRIPTION OF THE PREFERRED EMBODIMENTS

Figure 1:
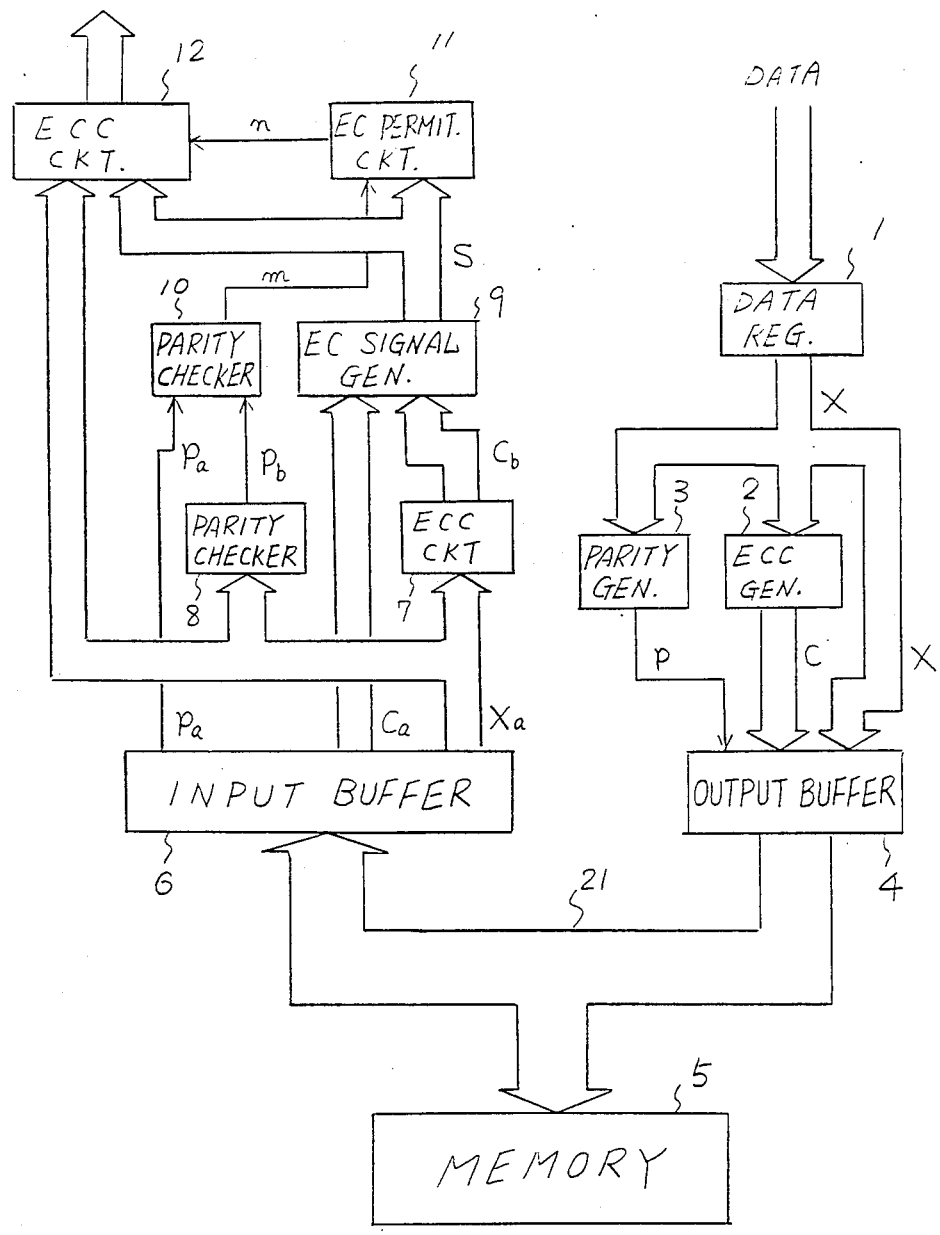
FIG. 1 is a block diagram of an embodiment according to the invention.

FIG. 1 shows an embodiment according to the invention in which data errors occurring in writing and reading a digital data into and out of a memory, that is, due to erroneous operation of a memory and/or input/output buffers are corrected and errors due to erroneous operation of an error correction circuit itself is suppressed.

For simplifying explanation, data X to be written in a memory is assumed as a 4-bit data ($x_1x_2x_3x_4$). The 4-bit data X is temporarily stored in a data register 1 and supplied to an error correcting code generator 2, a parity generator 3 and an output buffer circuit 4, respectively. The error correcting code generator 2 generates specified symbols (check bits) C based on the data X, which symbols are to be attached, or added, to the data X for automatically detecting and correcting an error in the data X when such an error occurs. In the present embodiment, the aforementioned ECC technique is used to generate the check bit C. Its basic principle will be outlined below, though described in detail in the above-mentioned articles.

In this example, a 3-bit error correcting code (check bits) is added to the data X. Thus, a new 7-bit word $(x_1x_2x_3x_4c_1c_2c_3)$ is obtained, which consists of input data $X=(x_1x_2x_3x_4)$ and three check bits $C_1$, $c_2$ and $c_3$ added to the input data, where $c_1$, $c_2$ and $c_3$ are parity check bits obtained on the basis of three bits selected from four component bits $\{x_1,x_2,x_3,x_4\}$ of the original data word, for example $\{x_1,x_2,x_4\}$, $\{x_1,x_3,x_4\}$, and $\{x_2,x_3,x_4\}$. In other words, $c_1$, $c_2$ and $c_3$ are so defined as to realize the following relationship.

$$\begin{cases} x_1 \oplus x_2 \oplus x_4 \oplus c_1 = 0 \\ x_1 \oplus x_3 \oplus x_4 \oplus c_2 = 0 \\ x_2 \oplus x_3 \oplus x_4 \oplus c_3 = 0 \end{cases} \quad (1)$$

where symbol "$\oplus$" denotes an exclusive OR operation.

The thus-defined code word $(x_1x_2x_3x_4c_1c_2c_3)$ is subjected to three different parity checks, which checks are carried out in the same way as in the equation (1) and expressed in the following matrix form (referred to as a parity check matrix);

$$H = \begin{pmatrix} x_1 & x_2 & x_3 & x_4 & c_1 & c_2 & c_3 \\ 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{pmatrix} \quad (2)$$

If it is a correct code word, all the three different parity checks result in zero, which is expressed by $$(x_1x_2x_3x_4c_1c_2c_3)H^t = (000)$$

For example, taking $(x_1x_2x_3x_4c_1c_2c_3)=(1011010)$, gives $$(1\ 0\ 1\ 1\ 0\ 1\ 0)\begin{pmatrix} 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{pmatrix}^t .$$

$$= ((1 \cdot 1 \oplus 0 \cdot 1 \oplus 1 \cdot 0 \oplus 1 \cdot 1 \oplus 0 \cdot 1 \oplus 1 \cdot 0 \oplus 0 \cdot 0)$$
$$(1 \cdot 1 \oplus 0 \cdot 0 \oplus 1 \cdot 1 \oplus 1 \cdot 1 \oplus 0 \cdot 0 \oplus 1 \cdot 1 \oplus 0 \cdot 0)$$
$$(1 \cdot 0 \oplus 0 \cdot 1 \oplus 1 \cdot 1 \oplus 1 \cdot 1 \oplus 0 \cdot 0 \oplus 1 \cdot 0 \oplus 0 \cdot 1))$$

$$= (0\ 0\ 0)$$

Thus it can be checked whether or not the data word is correct.

Now, let us assume that errors occur on the data $(x_1x_2x_3x_4c_1c_2c_3)$, resulted in an erroneous data $A = (a_1a_2a_3a_4a_5a_6a_7)$. For example, the two bits $x_2$ and $c_1$ are assumed to be subjected to the errors. In this case, the resultant data A can be expressed as $$(a_1a_2a_3a_4a_5a_6a_7)=(x_1\bar{x}_2x_3x_4\bar{c}_1c_2c_3),$$

where $\bar{s}_2$ and $\bar{c}_1$ represent inverted $x_2$ and $c_1$, respectively. Then, $$(a_1a_2a_3a_4a_5a_6a_7) = (x_1x_2 \oplus 1\ x_3x_4c_1 \oplus 1\ c_2c_3)$$

$$= (x_1x_2x_3x_4c_1c_2c_3) \oplus (0\ 1\ 0\ 0\ 1\ 0\ 0)$$

Accordingly, the resultant data $(a_1a_2a_3a_4a_5a_6a_7)$ is interpretable to be the exclusive OR operation of the correct data $(x_1x_2x_3x_4c_1c_2c_3)$ and an error $(e_1e_2e_3e_4e_5e_6e_7)=(0100100)$. The $(e_1e_2e_3e_4e_5e_6e_7)$ is termed an error pattern. When an error occurs on a single bit, that is, a single error occurs, the number (weight) of "1" in the error pattern is 1. In the above-stated example, the weight is "2", which indicates that a double error has occurred.

Parity check when an error or errors have arisen is expressed as $$(a_1a_2a_3a_4a_5a_6a_7) H^t = \{(x_1x_2x_3x_4c_1c_2c_3) \oplus (e_1e_2e_3e_4e_5e_6e_7)\}H^t \quad (3)$$

$$= (x_1x_2x_3x_4x_1x_2x_3)\ H^t \oplus (e_1e_2e_3e_4e_5e_6e_7)\ H^t$$

$$= (e_1e_2e_3e_4e_5e_6e_7)\ H^t$$

$$= (s_1s_2s_3)$$

Namely, the results of three different parity checks are those of parity checks on error pattern itself, and $(s_1s_2s_3)$ is called syndrome.

Letting weight of error pattern be 1 (or a single error), for example, $e_1=1$, then $(s_1s_2s_3)$ is a transportion of the first row of the parity check matrix H. That is, syndrome can be the transposition of the column vector of the matrix H correspondent to the error bit position.

Thus in the case of a single error, by making all column vectors of H different from each other, the column number of H to be detected, or the error bit position, can be known from the syndrome. If the error bit position is known, correction can be accomplished by inversion of the error bit, because of its binary notation. For example, if $(s_1s_2s_3)=(110)$ for H expressed by equation (2), it can be known that the error has occurred on the first bit, because the column vector $(110)^t$ exists in first column. Error correction is obtained by determining an error bit position designating code $\tilde{A}$ developed according to the following equation (4) for the resultant (error) data A and then making the exclusive OR operation of the error bit position designating code $\tilde{A}$ thus determined and the erroneous data A:

$$\tilde{A} = \begin{pmatrix} s_1 \wedge s_2 \\ s_1 \wedge s_3 \\ s_2 \wedge s_3 \\ s_1 \wedge s_2 \wedge s_3 \\ 0 \\ 0 \\ 0 \end{pmatrix}^t \quad (4)$$

where a symbol " " denotes the logical "AND" operation. Even if an error has occurred on the error correcting code $a_5$, $a_6$ and $a_7$ in the data A, correction of that error is not necessary, because error correction is only needed for the data bits $a_1$, $a_2$, $a_3$ and $a_4$. Accordingly, error correction for the ECC bits are not done and $\hat{a}_5$, $\hat{a}_6$, $\hat{a}_7=0$ in the equation (4).

If data A giving a syndrome $(s_1s_2s_3)=(110)$ is represented by $(0011010)$, substitution of the syndrome in equation (4) gives $$\tilde{A} = \begin{pmatrix} 1 \wedge 1 \\ 1 \wedge 0 \\ 1 \wedge 0 \\ 1 \wedge 1 \wedge 0 \\ 0 \\ 0 \\ 0 \end{pmatrix}^t = (1000000)$$

Then an exclusive OR operation of the data A and the obtained $\tilde{A}$ is performed to attain a corrected word, as expressed by $$A \oplus \tilde{A} = (0011010) \oplus (1000000)$$
$$= (1011010)$$

As described above, a single bit error correction can be performed. The description of a double bit error is given below: Letting both $e_i$ and $e_j$ of error pattern be 1, then syndrome $(s_1s_2s_3)$ is the transposition of the exclusive OR operation of column vectors $h_i$ and $h_j$ of the i-th and j-th columns of H, as expressed by $$(s_1s_2s_3) = (h_i \oplus h_j)^t.$$

On the assumption that all column vectors are different from each other, the following relationship will not occur:

$$(s_1s_2s_3) = (h_i \oplus h_j)^t = (000)$$

and hence there is no concern to misjudge an error free condition when errors have really arisen. If H has such a structure that $h_i \oplus h_j$ is equal to the third column vector $h_l$, a misjudgement may occur. That is, in spite of the occurrence of a double error, a single error in the l-th bit is judged, resulting in a miscorrection. For example, in the aforesaid H, exclusive OR function of the first column vector and the third column vector gives $$\begin{pmatrix}1\\1\\0\end{pmatrix} \oplus \begin{pmatrix}0\\1\\1\end{pmatrix} = \begin{pmatrix}1\\0\\1\end{pmatrix}$$

which is equal to the second column vector. This leads to misjudgement of (0100000) as (1010000), and as a result leads to the erroneous correction with inverting of the second bit. For avoiding such miscorrection and for distinguishing a double bit error from a single bit error, H must have such a structure that any result of the exclusive OR operation of three arbitrary column vectors of H does not give a zero vector, i.e., three arbitrary column vectors are in a primary independence relationship to each other.

On the basis of the above-described ECC principle, the error correcting code generator 2 takes out three partial groups of three components (bits) of input data X, which are independent of each other, and generates three parities in accordance with operation according to equation (1):

$$c_1 = x_1 \oplus x_2 \oplus x_4$$

$$c_2 = x_1 \oplus x_3 \oplus x_4$$

$$c_3 = x_2 \oplus x_3 \oplus x_4$$

The obtained check bits $c = (c_1c_2c_3)$ are applied to an output buffer 4.

The parity generator 3 generates a parity bit p such that the number of "1" in the binary bits of the input (4-bit) data X and the parity bit is always even (or is odd), and applies it to the output buffer 4.

Figures 2, 3:
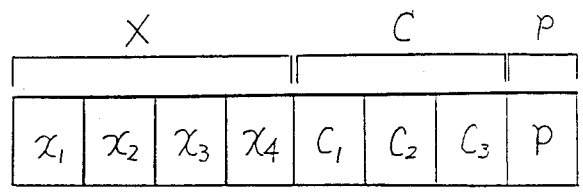

The output buffer 4 receives the input data X from the data register 1, the check bit C from the error correcting code generator 2 and the parity bit p from the parity generator 3, and transmits them to a memory via a data bus 21 to write them in a predetermined address location of the memory 5 in the data format shown in FIG. 2.

On the other hand, the content of the predetermined address location of the memory 5 is read out and transmitted to an input buffer 6 via the data bus 21. Data $X_a$ corresponding to the input data X is applied from the input buffer 6 to an error correcting code generator 7, a parity generator 8 and an error correction circuit 12. Besides, the check bit $C_a = (c_{a1}c_{a1}c_{a1})$ corresponding to the check bit C is applied from the input buffer 6 to the error-correcting signal generator 9, and the parity bit $p_a$ corresponding to the parity bit p is supplied to a parity checker 10. It is noted here that if there is no errors in the operation of the output buffer 4, memory 5 and input buffer 6, then, of course, $X = X_a$, $C = C_a$, and $p = p_a$.

The error correcting code generator 7 may have the same circuitry as the error correcting code generator 2, and hence it is favorable to employ a single circuit in common for use as 2 and 7 in both writing and reading by using time sharing techniques. The error correcting code generator 7 generates check bits $C_b = (c_{b1}c_{b2}c_{b3})$ on the basis of ECC principle from the received data $X_a$ and supplies them to the error correcting signal generator 9. The generator 9 receives check bits $C_a$ and $C_b$ from the input buffer 6 and the error correcting code generator 7, respectively. The generator 9 compares the check bits $C_a$ and $C_b$ and when a difference is found outputs $(s_1s_2s_3)$ indicating bit positions to be corrected, as an error correcting signal S to an error correction permitting circuit 11 and an error correction circuit 12. In accordance with the aforesaid equation (3), the signal generator 9 outputs error correcting signal (syndrome): $S = (s_1s_2s_3)$ $$s_1 = c_{a1} \oplus c_{b1}$$

$$s_2 = c_{a2} \oplus c_{b2}$$

$$s_3 = c_{a3} \oplus c_{b3}$$

It is noted that, when $s_1$, $s_2$ and $s_3$ are all "0", there are no errors in the output buffer 4, memory 5 and input buffer 6, whereas, if at least one of them is "1", there is error somewhere.

The parity generator 8 may have the same configuration as the parity generator 3, and hence it is favorable to use a single common circuit for both of 8 and 3 in writing and reading using the time sharing techniques. Thus, the parity generator 8 generates a parity bit $P_b$ based on the data $X_a$ from the input buffer 6, and supplies it to a parity comparator or checker 10. The parity checker 10 receives parity bits $p_a$ and $p_b$, each being one bit, and checks both bits as stated below, and the checking result is applied to an error correction permitting circuit 11 as a parity error signal m:

$$m = p_a \oplus p_b$$

If the result m is "0", both parity bits agree with each other, and if "1", they are different from each other.

The error correction permitting circuit 11 receives the error correcting signal S and the parity check result m. When m is "1", that is, parity error is detected, and when the error correcting signal S indicates a single error, then an error correction permitting signal n is generated and applied to the error correction circuit 12. The error correction circuit 12 decodes the error correction signal S, only when it receives the error correction permitting signal n. The coded result is added to the corresponding bit of data $X_a$ from the input buffer 6 to correct the error. When it receives no error correction permitting signal n, the circuit 12 outputs the data $X_a$ read out from the memory 5 as it is, that is, without making error correction.

The correction of data $X_a$ is performed in response to signal S as follows:

Firstly, according to equation (4), error bit locating code $\hat{X}$ is developed, and in response to the correction permitting signal n, an exclusive OR operation of $X_a$ and X is carried out to obtain a corrected data $X_0$ expressed as $$X_0 = X_a \oplus \hat{X}.$$

On the other hand, when the circuit 12 receives no error correction permitting signal n, the data $X_a$ received from the input buffer 6 is outut as it is.

It should be noted here that such error correction is performed only when parity error is detected and error correcting signal S indicates a single error, and in the other cases, correction is not allowed for the following reasons:

If error is detected in the error correcting signal S and the parity bit is normal, then the correction of data $X_a$ is not allowed, because the presence of error in the error correcting signal S means that error is included in the ECC system, and error correction of the ECC system may cause a fatal change of data information, thus the entire influence brought about by performing no error correction is rather smaller than making the error correction. When the error correcting signal S is normal, components of signal S, $s_1 s_2 s_3$, are all "0". Therefore, even if the parity bit has been confirmed incorrect, it is impossible to make a correction. Thus, in this case, the data $X_a$ is output as it is. In the case both signal S and p indicate correct data, no error correcting operation is done. The above-stated relationships are summarized in FIG. 3. FIG. 4 indicates the detailed error correcting operation concerning the data $X_a$, $C_a$ and p. In FIG. 4, "O" and "X" on $X_a$, $C_a$ and p represent the correct data and erroneous data, respectively, and "1" and "0" on m and n represent the existence and absence of the signals m and n, respectively. While, "1" and "0" on S means the existence and absence of single bit error in the data S, respectively. As is clearly understandable from FIG. 4, the error correcting permitting signal n is generated only under F, G and H cases. In the cases F and G, however, the data $X_a$ is output as it is since the error bit can not be specified by the data (syndrome) S on the basis of equation (4). As a result, the error correcting circuit 12 corrects the error under the case H. Therefore, the present invention is capable of protecting the correct or slightly erroneous data $X_a$ from being destroyed or being fatally destroyed according to the erroneous check bits C. The above-described embodiment is of 4-bits input data. When there is a large number of data bits, error correction is realizable by adding a small number of redundancy bits, which contribute to prevention of miscorrection, thus the effect of the invention being encouraged. Although the embodiment shown in FIG. 1. employs the memory 5, it can be applied to such a case that the output buffer 4 transmits the data X, C and p to a transmission line or another external circuit and the input buffer 6 receives the data $X_a$, $C_a$ and $p_a$ from the transmission line or the other external circuit.

As described above, the invention has the feature that an error correction system and a data parity checker are used in combination, and error correction is performed on the basis of the outputs of both circuits, which provides the advantage of enabling one to prevent the correct data from being subjected to miscorrection and being destroyed due to erroneous operation of the error correction code generator and incorrect error correcting code.

What is claimed is:

1. An error correcting system comprising:
    a first error correcting code geneator means responsive to a data word for generating a first error correcting code to be added to the data word to be transmitted;
    a first parity bit generator means responsive to said data word for generating a first parity bit associated with said data word;
    a transmitting means for transmitting said data word, said first error correcting code and said first parity bit to an external circuit;
    a receiving means for receiving through said external circuit a received data word, a received first error correcting code, and a received first parity bit;
    a second error correcting code generator means responsive to said received data word for generating a second error correcting code to be added to the received data word;
    a second parity bit generator means responsive to said received data word for generating a second parity bit associated with said received data word;
    an error correction signal generator means for comparing said received first error correcting code and said second error correcting code and generating an error correction signal when a difference between said received first error correcting code and said second error correcting code is found;
    a parity check means for comparing said received first parity bit and said second parity bit and outputting a parity error signal when said received first parity bit and said second parity bit are different;
    an error correction permitting means for outputting an error correction permittng signal ony when both said error correction signal and said parity error signal are generated; and
    an error correction circuit means for correcting an error of said received data word in accordance with said error correction signal only when said error correction permitting signal is output, said error correction circuit outputting said received data word without error correction when said error correction permitting signal is not output.

2. An error correcting system according to claim 1, wherein said external circuit includes a memory for storing said data word to be transmitted, together with said first error correcting code and said first parity bit, said transmitting means including an output buffer circuit coupled to said memory and said receiving means an input buffer circuit coupled to said memory.

3. An error correcting system according to claim 1, wherein said first and second error correcting code generator means include a single common error correcting code generator used in a time sharing manner.

4. An error correcting system according to claim 3, wherein said error correcting code generator includes a circuit for generating check bits based on a predetermined error correcting code technique.

5. An error correction apparatus comprising:
   a receiving means for receiving a digital data, a first error correcting code added to said digital data for correction of bit error thereof, and a first parity bit associated with said digital data,
   a first generating means coupled to said receiving means for generating a second error correcting code based on the received digital data,
   a second generating means coupled to said receiving means for generating a second parity bit based on the received digital data,
   a third generating means coupled to said receiving means and said first generating means for comparing the received first error correcting code and the generated second error correcting code and generating an error correction signal when said first and second error correcting codes are different,
   a fourth generating means coupled to said receiving means and said second generating means for comparing the received first parity bit and the generated second parity bit and generating a parity error signal when a difference is detected between said first and second parity bits,
   a fifth generating means coupled to said third and fourth generating means for generating a permission signal only in respose to generation of both said error correction signal and said parity error signal, and
   an error correction means coupled to said receiving means and said fourth and fifth generating means for correcting error of the received digital data by use of said error correction signal only when said permission signal is generated, said error correction means outputting said received digital data as it is when said permission signal is absent.

6. A combination comprising:
   a memory,
   an error correcting code generator,
   a parity bit generator,
   an error correction circuit,
   a means for supplying a digital data to be stored in said memory to said error correcting code generator to obtain a first error correcting code based on said digital data to be stored,
   a means for supplying said digital data to be stored in said memory to said parity bit generator to obtain a first parity bit based on said digital data to be stored,
   a means for writing said digital data, said first error correcting code and said first parity bit into a predetermined address location of said memory,
   a means for reading said digital data, said first error correcting code and said first parity bit from said predetermined address location of said memory,
   a means for supplying the read-out digital data to said error correcting code generator to obtain a second error correcting code based on said read-out digital data,
   a means for supplying said read-out digital data to said parity bit generator to obtain a second parity bit based on said read-out digital data,
   a means for comparing the read-out first error correcting code and said second error correcting code and generating a first signal designating error bit when said first and second error correcting codes are different,
   a means for comparing the read-out first parity bit and said second parity bit and generating a second signal when parity error is detected,
   a means for generating a third signal only in response to generation of said first and second signals, and
   a means for supplying said third signal to said error correction circuit, said error correction circuit performing error correction of the read-out digital data in response to presence of said third signal stopping the error correction in response to absence of said third signal.

7. A method of error correcting comprising the steps of:
   generating a first error correcting code to be added to a data word to be transmitted;
   generating a first parity bit associated with said data word;
   transmitting said data word, said first error correcting code and said first parity bit to an external circuit;
   receiving through said external circuit a received data word, a received first error correcting code, and a received first parity bit;
   generating a second error correcting code to be added to the received data word;
   generating a second parity bit associated with said received data word;
   comparing said received first error correcting code and said second error correcting code and generating an error correction signal when a difference between said received first error correcting code and said second error correcting code is found;
   comparing said received first parity bit and said second parity bit and outputting a parity error signal when said received first parity bit and said second parity bit are different;
   outputting an error correction permitting signal only when both said error correction signal and said parity error signal are generated; and
   correcting an error of said received data word in accordance with said error correction signal only when said error correction permitting signal is output, said error correction step outputting said received data word without error correction when said error correction permitting signal is not output.

8. An error correction method comprising the steps of:
   receiving a digital data, a first error correcting code added to said digital data for correction of bit error thereof, and a first parity bit associated with said digital data,
   generating a second error correcting code based on the received digital data, generating a second parity bit based on the received digital data, comparing the received first error correcting code and the generated second error correcting code and generating an error correction signal when said first and second error correcting codes are different, comparing the received first parity bit and the generated second parity bit and generating a parity error signal when a difference is detected between said first and second parity bits, generating a permission signal only in response to generation of both said error correction signal and said parity error signal, and correcting error of the received digital data by use of said error correction signal only when said permission signal is generated, said error correction means outputting said received digital data as it is when said permission signal is absent.

9. A method of error correction employing a memory, an error correcting code generator, a parity bit generator, and an error correction circuit, comprising the steps of:

supplying a digital data to be stored in said memory to said error correcting code generator to obtain a first error correcting code based on said digital data to be stored, supplying said digital data to be stored in said memory to said parity bit generator to obtain a first parity bit based on said digital data to be stored, writing said digital data, said first error correcting code and said firt parity bit into a predetermined address location of said memory, reading said digital data, said first error correcting code and said first parity bit from said predetermined address location of said memory, supplying the read-out digital data to said error correcting code generator to obtain a second error correcting code based on said read-out digital data, supplying said read-out digital data to said parity bit generator to obtain a second parity bit based on said read-out digital data, comparing the read-out first error correcting code and said second error correcting code and generating a first signal designating error bit when said first and second error correcting codes are different;

comparing the read-out first parity bit and said second parity bit and generating a second signal when parity error is detected;

generating a third signal only in response to generation of said first and second signals, and supplying said third signal to said error correction circuit, said error correction circuit performing error correction of the read-out digital data in response to the presence of said third signal stopping the error correction in response to the absence of said third signal.

* * * * *